United States Patent [19]

Endo

[11] Patent Number: 4,894,704
[45] Date of Patent: Jan. 16, 1990

[54] LEAD FRAME HAVING PROJECTIONS FOR RESIN MOLDING

[75] Inventor: Kazuyuki Endo, Aizuwakamatsu, Japan

[73] Assignee: Motorola Inc., Schaumburg, Ill.

[21] Appl. No.: 282,646

[22] Filed: Dec. 12, 1988

[30] Foreign Application Priority Data

Jan. 28, 1988 [JP] Japan .................. 63-15858

[51] Int. Cl.⁴ .................. H01L 23/48; H01L 23/28
[52] U.S. Cl. .................. 357/70; 357/72
[58] Field of Search .................. 357/70, 72, 69

[56] References Cited

U.S. PATENT DOCUMENTS 4,575,748 3/1986 Terui et al. .................. 357/70

Primary Examiner—James W. Davie
Attorney, Agent, or Firm—Harry A. Wolin

[57] ABSTRACT

A lead frame comprising an inner lead part to be electrically connected to an internal device and contained within a mold cavity for being resin molded, and an outer lead part connected to the inner lead part, the inner lead part having a projection with which a resin flow having passed through a mold gate collides. Because the resin flowing through the mold gate collides with the projection near a cavity inlet and disperses, the molding resin can reach corners near the cavity inlet, and air can be purged off from the corners to obtain a no-void, satisfactory appearance of semiconductor package.

5 Claims, 4 Drawing Sheets

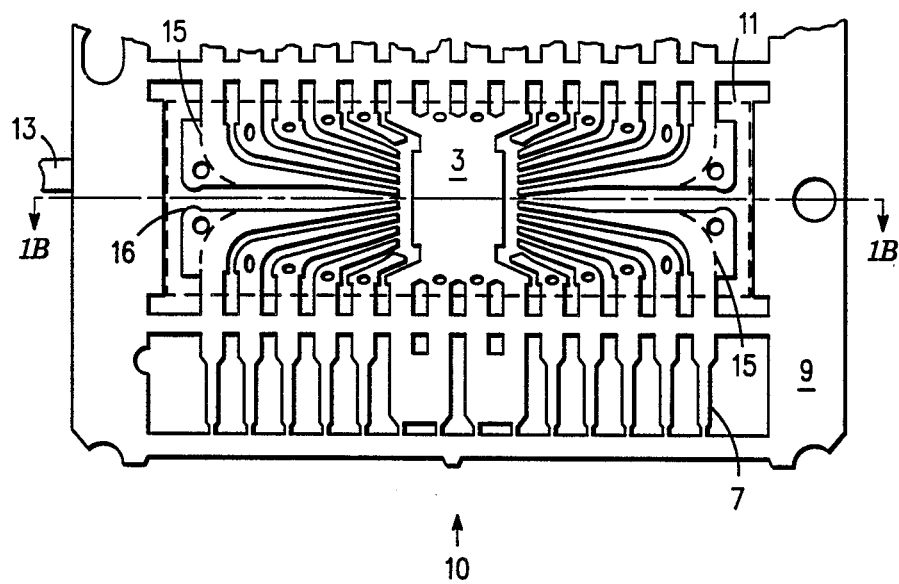
FIG. 1A
FIG. 1B
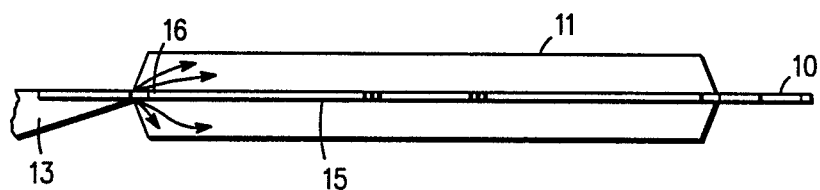

LEAD FRAME HAVING PROJECTIONS FOR RESIN MOLDING

BACKGROUND OF THE INVENTION

1. Field of the Invention

The present invention relates to a lead frame, and particularly to a lead frame to be used for a semiconductor integrated circuit and that is capable of preventing generation of any vacancy or void in a molded resin when the semiconductor circuit chip is encapsulated by the resin. p 2. Description of the Prior Art FIGS. 5(A) and (B) show a prior art lead frame 1 to be used for a semiconductor integrated circuit. Lead frame 1 is provided with a base part 3 on which a semiconductor circuit device (chip) is to be mounted. Lead frame 1 comprises an inner lead part 5, an outer lead part 7 continued from inner lead part 5, and an outer frame part 9.

In this prior art lead frame 1, a semiconductor chip is mounted on the base part 3. Each bonding pad of the semiconductor chip and a corresponding inner lead node portion are connected by a bonding wire, and then resin molding is carried out within a metallic mold or the like which is not illustrated in FIG. 5 (A) or 5 (B). One-dot chain lines in FIG. 5 (A) indicate a cavity part 11 of the metallic mold and a gate part 13 for pouring a resin into the cavity part 11. FIG. 5 (B) shows a cross-sectional view taken from line 5B—5B of the gate part 13 and the cavity part 11. After the lead frame 1 having the semiconductor chip mounted thereon is set in the metallic mold, a resin is poured through the gate part 13.

However, in such a prior art lead frame, since a space between the gate part 13 and the inner lead is wide, a molding resin can flow relatively smoothly without obstacles, and the molding resin is apt to take in air when passing through the gate part 13. Besides, a pressure transfer efficiency to corners of the mold cavity part 11 near the gate part outlet is very low, therefore vacancies (voids) of the resin are very easily generated near the corners. Such voids could be improved to some extent by increasing the transfer rate and pressure of the molding resin and designing the shape of resin passage-way in a transfer mold. However, these measures can not completely prevent the void. Besides, such measures also provide disadvantages. For example, that a wire flow of the inner lead will occur by the excessive increase of the transfer rate, and that a so-called mold flash may be produced due to the highness of the transfer pressure.

SUMMARY OF THE INVENTION

In view of the aforementioned problems inherent in the prior art lead frame, an object of the invention is to provide a lead frame which can prevent voids from being produced in a resinmolded package of a semiconductor integrated circuit or the like, thereby ensuring a perfect resin encapsulating and a satisfactory surface appearance and shape.

To attain the aforementioned object, the lead frame according to the invention comprises an inner lead part electrically connected to an internal device and contained within a mold cavity together with the internal device for being resin molded, and an outer lead part connected to the inner lead part. The inner lead part has at least one projection. A resin flow passes through the mold and collides with the projection. The internal device may be, for example, a semiconductor integrated circuit chip.

In the aforementioned structure according to the invention, immediately after passing through the gate of the mold, the resin flow collides first with the projection of the inner lead near an inlet of the cavity. The air at corners near the cavity inlet is purged away and consequently, pressure transfer efficiency and the corners is enhanced, the resin fills thoroughly in the corners, and thus voids within the package and external voids will be satisfactorily prevented.

BRIEF DESCRIPTION OF THE DRAWINGS

FIG. 1 (A) and FIG. 1 (B) illustrate a plan view showing a structure of a lead frame according to one embodiment of the invention and a sectional view taken along line 1B—1B respectively;

DETAILED DESCRIPTION OF THE PREFERRED EMBODIMENT

Figure 5A:
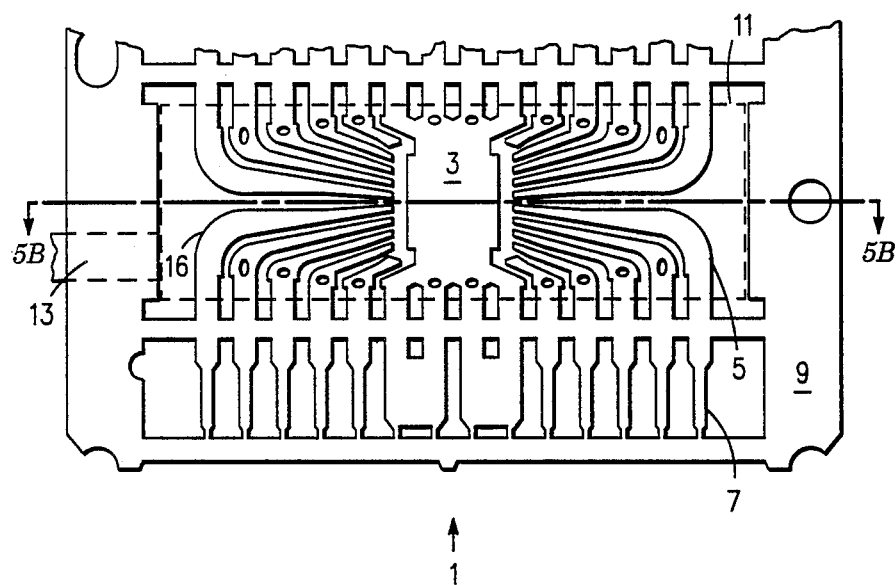
FIG. 5 (A) and FIG. 5 (B) are a plan view showing a shape of prior art lead frame and a sectional view taken along line 5B—5B, respectively.
Figure 5B:
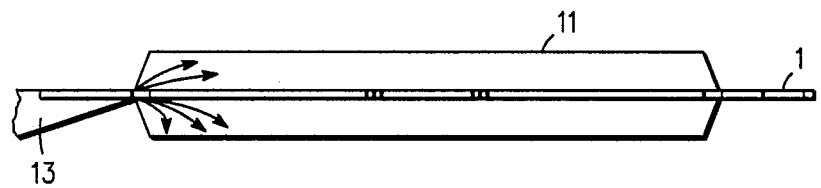

The invention will now be described in detail with reference to the accompanying drawings representing one preferred embodiment thereof. FIG. 1 (A) and FIG. 1 (B) show a lead frame 10 according to one embodiment of the invention. As in FIG. 5 (A), lead frame 10 of this embodiment is also provided with a base part 3 on which a semiconductor circuit device (chip) is to be mounted. Lead frame 10 comprises inner lead parts 15, outer lead parts 7 continued from the respective inner lead parts 15, and an outer frame part 9. These inner lead parts 15 are different from those of FIG. 5 in shape. More specifically, as shown in FIG. 1 (A), a projection or extended portion 16 is formed at the edge of the inner lead part 15 nearest to a gate part 13. Four projections 16 may be provided respectively on the outside edges of the four inner lead parts in the corners, as shown in FIG. 1 (A). A broken line indicates a shape of the inner lead of the prior art lead frame shown in FIG. 5 (A).

In lead frame 10 according to the present invention, a semiconductor chip is mounted on base part 3, and each bonding pad of the semiconductor chip is connected to a node portion of corresponding inner lead of the inner lead part 15 by a bonding wire. Thereafter, inner lead parts 15, the chip and the wires are enclosed in a mold cavity 11 indicated by a one-dot chain line in FIG. 1 (A) to be subjected to resin molding. As shown in FIG. 1 (B), resin flows through gate part 13 into cavity 11, collides with projection 16 of inner lead part 15 of the lead frame nearest to gate part 13, and disperses in all directions as indicated by the arrows. Thus, the resin flow steadily drives away air from the cavity corners near gate part 13, and the resin fills thoroughly within the cavity 11.

FIGS. 2 (A) through 2 (F) show a resin encapsulating process of a semiconductor integrated circuit incorporating the aforementioned lead frame 10 of the invention. In this process, first, a semiconductor chip is mounted on the base part 3 of the lead frame 10 and wire-bonded thereto, as described above. Then the wire-bonded lead frame 10 is set in a mold as shown in FIG. 2 (A). The mold has an upper die 21 and a lower die 23 illustrated by their cross-sections. The upper die 21 has a pot 29 into which a plunger 27 is inserted, and an upper cavity 25. The lower die 23 has a cull portion 39, a runner 37, a gate 35 and a lower cavity 33. When upper die 21 and lower die 23 are assembled, an air vent 31 is formed between them at their outlets. Gate 35 communicates with lower cavity 33 and cull portion 39 communicates with gate 35 through runner 37.

Next, as shown in FIG. 2 (B), upper die 21 and lower die 23 are clamped together, and then molding resin 41 is placed in pot 29 as shown in FIG. 2 (C). Then, as shown in FIG. 2 (D), plunger 27 is moved down by means of a cylinder of a mold press (not shown) to force the resin 41 into the cavity. The resin 41 is preferably a thermosetting resin, for example, such as an epoxy resin. The epoxy resin can be hardened by heating for a predetermined time duration in the mold as shown in FIG. 2 (E). Thus, whenever curing is over, the mold is re-leaded from clamping and a molding is extracted as shown in FIG. 2 (F).

Figure 2A:
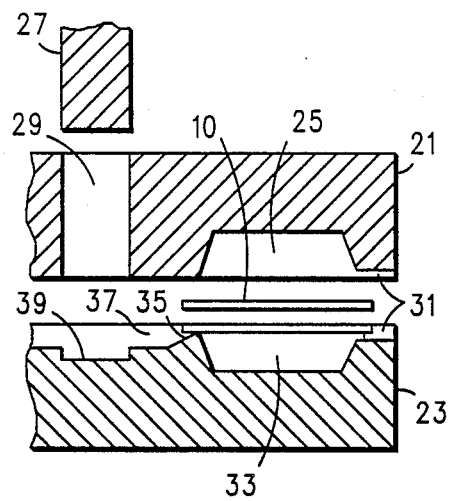
FIG. 2 (A) through FIG. 2 (F) show schematic views explaining a resin molding process of a semiconductor integrated circuit using the lead frame shown in FIG. 1.
Figure 2B:
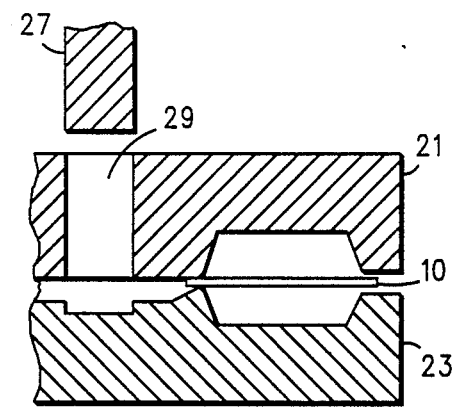
Figure 2C:
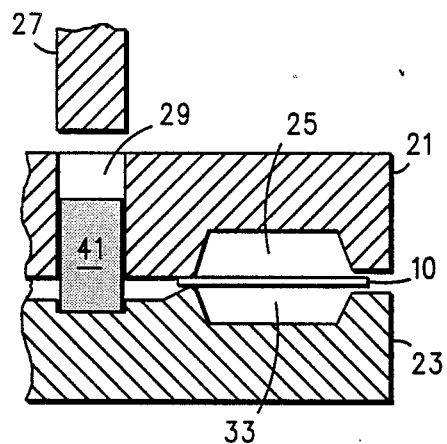
Figure 2D:
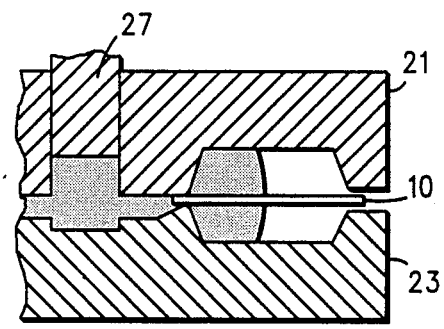
Figure 2E:
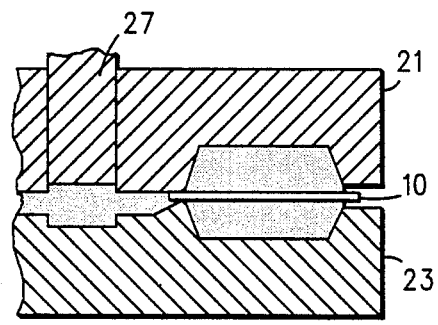
Figure 2F:
Figure 3:
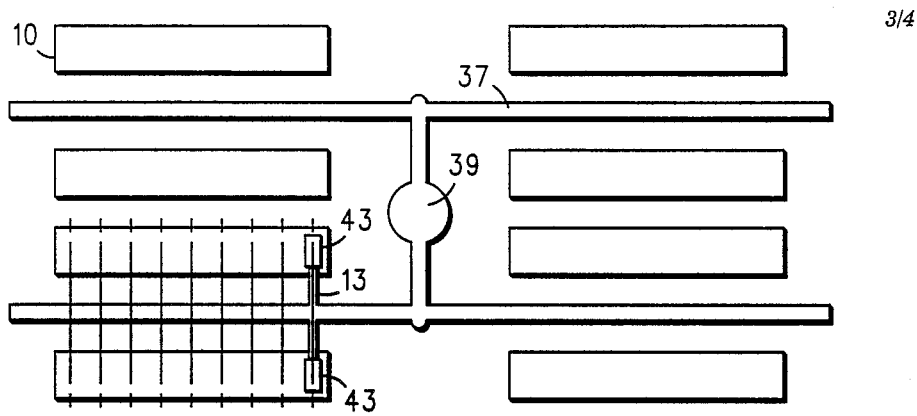
FIG. 3 is a plan view showing a general structure of a metallic mold used in the process of FIG. 2.

FIG. 3 shows a general structure of a transfer mold for resin-molding of a semiconductor device by using the lead frame 10 according to the invention. The mold has cull portion 39, runners 37 communicating with cull portion 39, and a multiplicity of cavities 43 communcating with runners 37 through gates 13. Each cavity 43 comprises a recession for molding a portion which constitutes a body of the semiconductor integrated circuit. The mold is usually so large as to receive 10 to 20 pieces of lead frames 10 therein.

In such structure, the lead frame 10 on which the semiconductor chip was mounted and wire-bonded is set in the mold as described above, and then resin is poured into each cavity 43 from a pot.

Figure 4A:
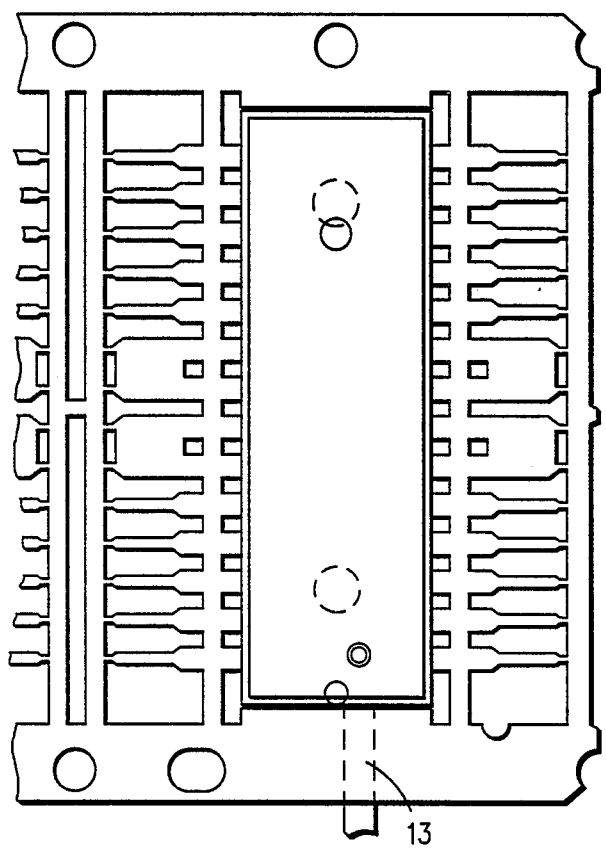
FIG. 4 (A), FIG. 4 (B) and FIG. 4 (C) are a plan view, a side view and a front view showing a resin-molded lead frame respectively.
Figure 4B:
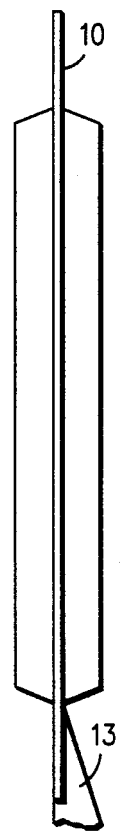
Figure 4C:
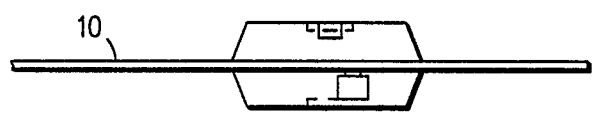

Thus, as shown in FIG. 4, a half-finished porduct is obtained in which the inner lead part of the lead frame is encapsulated by resin mold. A metal portion between the outer lead part and the outer leads of this half-finished product is cut off to separate them to obtain a final semiconductor product.

While each gate is formed on a lower side of the package in the above-described embodiment, the invention is not limited to such lower gate structure and each gate may be formed on an upper side of the package. If such upper gate structure is employed, voids are likely to occur particularly near an upper corner of the cavity inlet in the prior art. However, a use of the lead frame according to the invention effectively prevents void occurrence even in such case.

As described above, according to the invention, an occurrence of resin vacancy or void within a mold package of the semiconductor integrated circuit or the like will be advantageously prevented by forming a projection, and thus a precise resin encapsulating will be ensured and a satisfactory surface appearance and shape are provided.

What is claimed is:

1. A lead frame comprising:
   an inner lead part electrically connected to an internal device and contained within a mold cavity together with the internal device for being resin molded;
   and an outer lead part connected to the inner lead part;
   characterized in that said inner lead part has at least one projection with which a flow of resin for molding passed through a gate of the mold is collided thereby eliminating voids throughout said molding resin.

2. The lead frame as defined in claim 1, wherein said internal device is a semiconductor integrated circuit chip.

3. The lead frame as defined in claim 1 wherein the inner lead part includes four projections, one being disposed on each corner of said inner lead part.

4. A lead frame comprising an inner lead part having at least one projection for colliding with a resin flow during encapsulation to eliminate voids in said resin, said at least one projection being disposed on a corner of said inner lead part.

5. The lead frame of claim 4 wherein the inner lead part includes four projections, one being disposed on each corner of said inner lead part.

* * * * *